United States Patent
Brunn et al.

(10) Patent No.: US 7,784,004 B1
(45) Date of Patent: Aug. 24, 2010

(54) SKEW LOTS FOR IC OSCILLATORS AND OTHER ANALOG CIRCUITS

(75) Inventors: Brian T. Brunn, Austin, TX (US); Brian K. Seemann, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 891 days.

(21) Appl. No.: 11/111,135

(22) Filed: Apr. 21, 2005

Related U.S. Application Data

(62) Division of application No. 10/155,301, filed on May 23, 2002, now Pat. No. 6,912,698.

(51) Int. Cl.
G06F 17/50 (2006.01)
G06F 9/455 (2006.01)

(52) U.S. Cl. .................................. 716/11; 716/2; 716/4
(58) Field of Classification Search ...................... 716/4, 716/2, 11
See application file for complete search history.

(56) References Cited

U.S. PATENT DOCUMENTS

| | | | |
|---|---|---|---|
| 6,013,926 A * | 1/2000 | Oku et al. .................... | 257/284 |
| 6,130,173 A * | 10/2000 | Esses ........................... | 430/5 |
| 6,229,164 B1 | 5/2001 | Momose et al. | |
| 6,282,135 B1 | 8/2001 | Proebsting | |
| 6,515,338 B1 | 2/2003 | Inumiya et al. | |
| 6,912,698 B1 | 6/2005 | Brunn et al. | |
| 2001/0013604 A1 * | 8/2001 | Hase ........................... | 257/12 |
| 2001/0045603 A1 * | 11/2001 | Yamazaki et al. ............ | 257/347 |
| 2002/0117698 A1 * | 8/2002 | Inumiya et al. ............. | 257/288 |
| 2002/0118629 A1 * | 8/2002 | Suzuki et al. ............... | 369/116 |
| 2002/0158678 A1 * | 10/2002 | Sanduleanu ................. | 327/258 |
| 2002/0167366 A1 * | 11/2002 | Sanduleanu et al. ......... | 331/185 |
| 2003/0006851 A1 * | 1/2003 | Wood ................... | 331/107 SL |

* cited by examiner

*Primary Examiner*—Jack Chiang
*Assistant Examiner*—Suresh Memula
(74) *Attorney, Agent, or Firm*—Eduardo E. Drake; Scott Hewett; Lois D. Cartier

(57) ABSTRACT

Integrated circuits, key components in thousands of products, frequently include thousands and even millions of microscopic transistors and other electrical components. Because of difficulties and costs of fabricating these circuits, circuit designers sometimes ask fabricators to produce skew lots for testing and predicting manufacturing yield. However, conventional skew lots for CMOS circuits, which are based on increasing or decreasing transistor transconductance, are not very useful in testing certain types of analog circuits, such as oscillators. Accordingly, the present inventors developed a new type of skew lot, based on increasing or decreasing gate-to-source capacitance of transistors, or more generally a transistor characteristic other than transconductance. This new type of skew lot is particularly suitable for simulating, testing, and/or making yield predictions for oscillators and other CMOS analog circuits.

9 Claims, 5 Drawing Sheets

SKEW LOTS FOR IC OSCILLATORS AND OTHER ANALOG CIRCUITS

TECHNICAL FIELD

The present invention concerns fabrication and testing of integrated circuits, such as integrated oscillators and other analog circuits using CMOS technology.

BACKGROUND

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as an oscillator.

In mass-producing thousands of integrated circuits, each of which includes thousands or millions of interconnected transistors, the inevitable variances in fabricating each transistor mean that each circuit will not function exactly as intended by its designers. In fact, some of the circuits will operate slower than intended, and some of the devices will operate faster than intended. Those that operate too slow or too fast, that is, outside an acceptable range, will be discarded as waste. The percentage of the fabricated circuits that operate in the acceptable range define the manufacturing yield. A higher yield percentage means less waste and lower fabrication cost, whereas a lower yield percentage means greater waste and higher fabrication cost.

To determine whether a particular circuit can be economically produced in mass quantities, it is common practice for designers to ask fabricators to deliberately skew or alter the fabrication process to produce test sets of slow and fast circuits, known generally as skew lots. The fast and slow skew lots are made by skewing transistor dimensions, such as gate-insulator thickness (t) and channel length (L), to increase or decrease transconductance—a transistor property known to affect switching speed.

More precisely, since transconductance increases as the product of L and t decreases, fabricators reduce both L and t to make fast skew lots. Conversely, since transconductance decreases as the Lt product increases, they increase both L and t to make slow skew lots. Designers then test performance of these skew lots to predict or estimate the manufacturing yield of the circuit. The yield, in turn, tells designers whether the circuit design is acceptable or needs alterations to make fabrication more economical.

One problem that the present inventors identified with conventional skew lots is that for certain types of CMOS circuits (circuits that use complementary metal-oxide-semiconductor transistors), the performance of the fast and slow circuits is very similar, meaning that these skew lots are of little use in predicting manufacturing yield. For example, in conventional skew lots of CMOS oscillators (an oscillator is a circuit that outputs a signal that varies back and forth (continuously or discretely) between two voltage or current levels at a fixed or adjustable frequency), the speed of the so-called fast and slow oscillators were essentially identical in performance and thus were relatively useless in predicting yield for the oscillators.

Accordingly, the inventors recognized a need to devise new types of skew lots for CMOS oscillators and other types of circuits.

SUMMARY

To address these and other needs, the present inventors developed a new type of skew lot suitable for simulating, testing, and/or making yield predictions for circuits, such as oscillators. In contrast to conventional skew lots which are based on increasing or decreasing the transconductance of the transistors of a particular circuit, the new type of skew lot is based on increasing or decreasing a non-transconductance characteristic, such as the gate-to-source capacitance of the transistors.

One exemplary skew lot includes identically-configured fast and slow versions of an integrated circuit. The fast versions, which exhibit a decreased gate-to-source capacitance, include transistors with shorter than normal channels and thicker than normal gate insulators. And, the slow versions, which exhibit an increased gate-to-source capacitance, include field-effect transistors with longer channels and thinner gate insulators.

DETAILED DESCRIPTION OF EXEMPLARY EMBODIMENTS

The following detailed description, which references and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known in the art.

Exemplary Skew Lots

Figure 1:
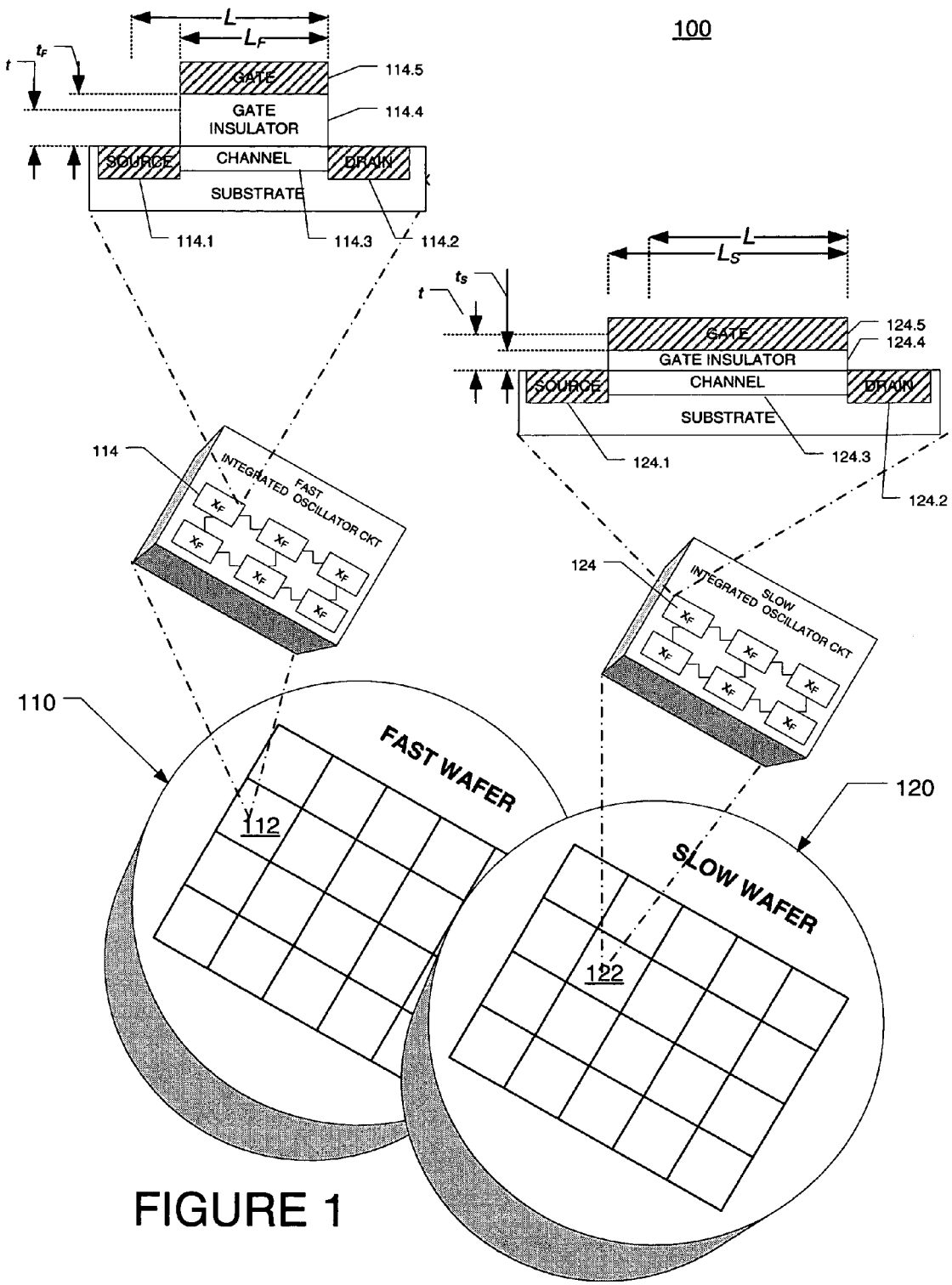
FIG. 1 is a conceptual diagram of an exemplary skew lot 100 incorporating the present invention.

FIG. 1 shows an exemplary skew lot 100 incorporating teachings of the present invention. Skew lot 100 includes at least one fast wafer 110 and at least one slow wafer 120. Some exemplary lots include 24 eight-inch wafers. (As used herein, the terms "fast" and "slow" refers to the operational speed or frequency of a circuit or circuit components relative to a nominal or average operational speed or frequency of the circuit. In a particular context, the terms can also refer to the corresponding dimensions or physical characteristics of one circuit relative to another. For example, a fast circuit not only operates at a higher speed or frequency than its corresponding nominal or average circuit, but also has corresponding dimensions or physical traits designated "fast" relative to those of the nominal or average circuit.

Figure 2:
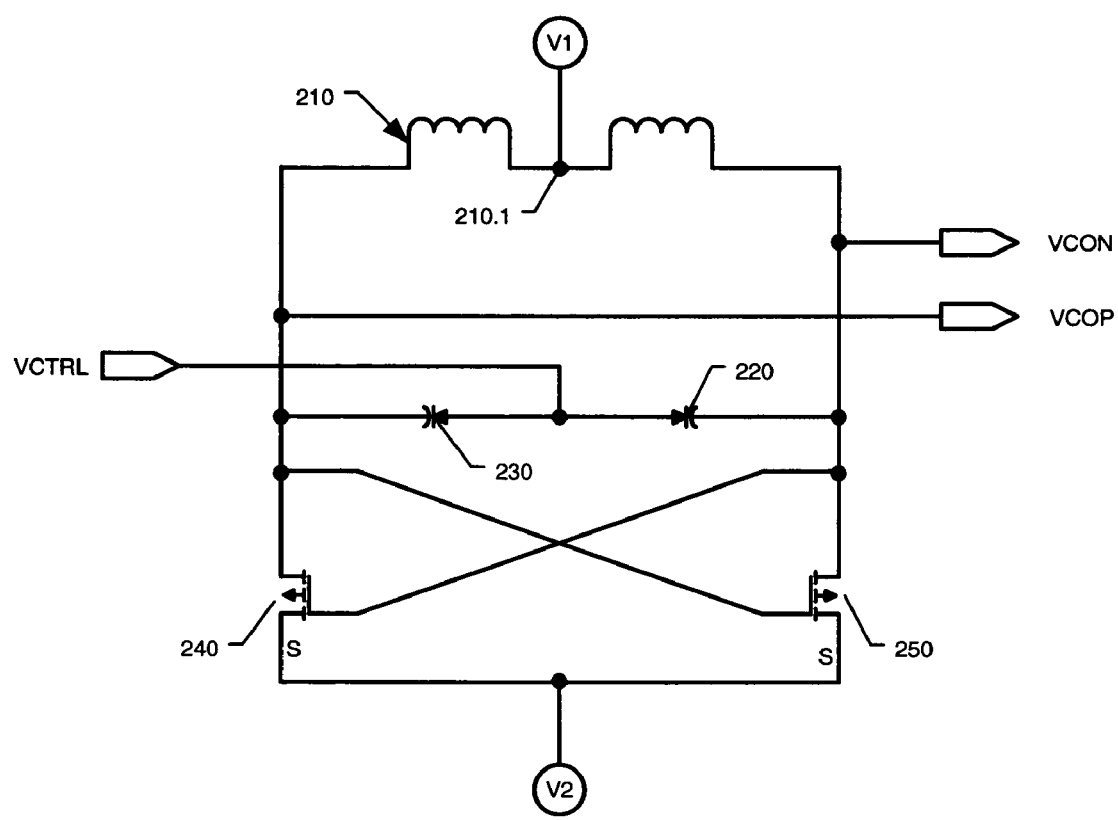
FIG. 2 is a schematic of an exemplary LC oscillator circuit suitable for use with the present invention.
Figure 5:
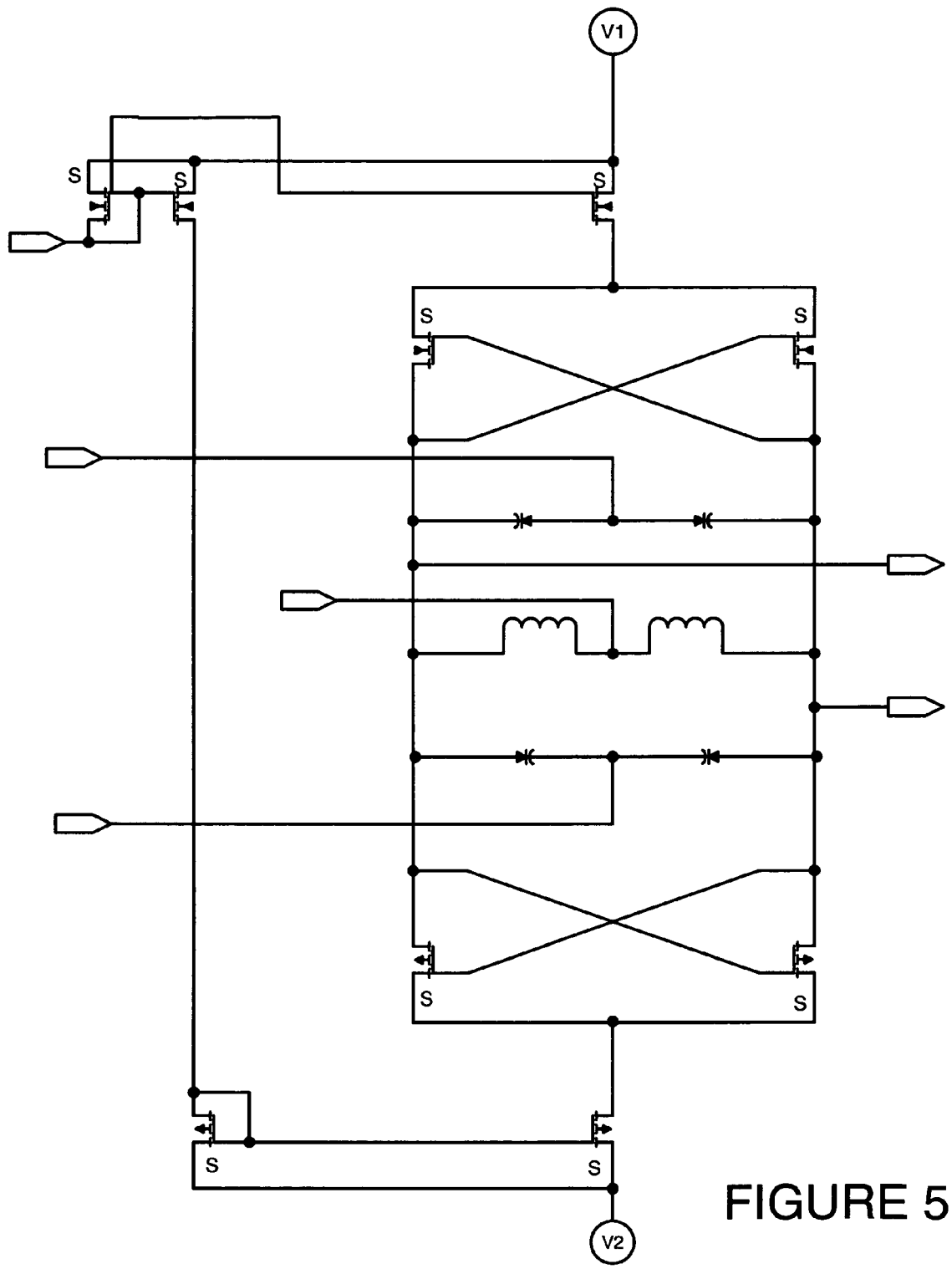
FIG. 5 is a schematic of another exemplary oscillator circuit suitable for use with the present invention.

Fast wafer 110 includes a number of substantially identical fast integrated-circuits, such as integrated circuit 112. Integrated circuit 112, for example, a negative-resistance (or LC) oscillator, such as that shown in circuit 200 of FIG. 2. Circuit 200 includes supply nodes V1 and V2, outputs VCON and VCOP, a center-tapped inductor 210, accumulation-mode metal-oxide-semiconductor (MOS) varactors 220 and 230, and cross-coupled field-effect transistors 240 and 250. Another exemplary oscillator circuit suitable for use with the present invention is shown in FIG. 5. Other types of analog CMOS circuits that may benefit from the present invention include differential amplifiers, sampling comparators, and bias circuits.

More generally, the circuit includes a number of substantially identical fast n- or p-channel metal-oxide-semiconductor field-effect transistors (mosfets), such as fast mosfet 114, which have been skewed in fabrication to have a less than nominal or average gate-to-source capacitance $C_{gs}$. For operation in the saturation region, $C_{gs}$ is defined as $$C_{gs} = \frac{2}{3} C_{ox} W L$$

where W denotes channel width; L denotes channel length; and $C_{ox}$ denotes gate-oxide (or more generally gate-insulation) capacitance. (Capacitance variation is also relevant for sub-threshold regions, but variation in these regions has negligible effect on the speed of the field-effect transistors.) Given that $C_{ox}$ is defined as the ratio of the gate-insulation permittivity $\epsilon$ to the gate-insulator thickness t, the expression for $C_{gs}$ can be rewritten as $$C_{gs} = \frac{2}{3} W \varepsilon \frac{L}{t}$$

which reveals that the magnitude of the gate-to-source capacitance $C_{gs}$ and thus the relative speed of certain types of integrated circuits can be controlled, for example, by regulating the nominal or average L/t ratio relative to a benchmark, such as a nominal or average $L_n/t_n$. Fast mosfet 114, for instance, has a low L/t ratio and thus exhibits less gate-to-source capacitance, which in turn translates into faster operation.

More particularly, fast mosfet 114 includes a source region 114.1, a drain region 114.2, a channel region 114.3, a gate insulator 114.4, and a gate 114.5. Source region 114.1 and drain region 114.2 define a fast-channel length $L^F$ of channel region 114.3. Fast-channel length $L_F$ is less than a nominal or average length $L_n$ such as 0.25 or 0.18 microns. In the exemplary embodiment, length $L_F$ is approximately 7 percent less than length $L_n$ for n-channel transistors and 5 percent less for p-channel transistors. Another embodiment sets length $L_F$ to be about 10 percent less than length $L_n$ for n-channel and 7 percent for p-channel transistors. The invention, however, is not limited to a particular fast-channel length.

Gate insulator 114.4, which is sandwiched between channel region 114.3 and gate 114.5, has a fast-insulator thickness $t_F$ that is greater than a nominal or average thickness $t_n$, for example 4.2 nanometers (nm). In the exemplary embodiment, thickness $t_F$ is approximately 6 percent greater than thickness $t_n$. Other embodiments set thickness $t_F$ to be about 10 percent greater than thickness $t_n$. The invention is not limited to a particular fast-insulation thickness.

In contrast to fast wafer 110, slow wafer 120 includes a number of substantially identical slow integrated-circuits, such as integrated circuit 122, which have the same topology as integrated circuit 112. Integrated circuit 122 includes a number of substantially identical slow mosfets, such as slow mosfet 124, which have a high L/t ratio (relative to $L_n/t_n$) and thus exhibit more gate-to-source capacitance, which in turn translates into slower operation.

More particularly, slow mosfet 124 includes a source region 124.1, a drain region 124.2, a channel region 124.3, a gate insulator 124.4, and a gate 124.5. Source region 124.1 and drain region 124.2 define a slow-channel length $L_s$ of channel region 124.3. Slow-channel length $L_s$ is less than channel length $L_n$. In the exemplary embodiment, length $L_F$ is approximately 7 percent less than length $L_n$ for n-channel transistors and 5 percent for p-channel transistors. Other embodiments set length $L_F$ at about 10 percent less than length $L_n$ for n-channel and 7 percent for p-channel transistors. However, the invention is not limited to a particular slow-channel length.

Gate insulator 124.4, which is sandwiched between channel region 124.3 and gate 124.5, has a slow-insulator thickness $t_s$ which is greater than nominal thickness $t_n$. In the exemplary embodiment, thickness $t_s$ is approximately 6 percent greater than thickness $t_n$ for both n- and p-channel transistors; another embodiment sets thickness $t_s$ at about 10 percent greater than thickness $t_n$. The invention is not limited to a particular slow-insulator thickness variation.

In the exemplary fast and slow circuits, all the constituent transistors of the circuits are fast or slow. However, other embodiments make only a select set of the constituent transistors fast or slow. The select set of transistors has a greater impact on circuit speed than other transistors in the circuit.

Table 1 provides a side-by-side comparison of conventional skew lot dimensions and the exemplary skew lot dimensions.

TABLE 1

Conventional Skew Lot Dimensions vs. Exemplary Skew Lot Dimensions for Constant Channel Width

|  | Gate Insulator Thickness relative to normal thickness | Channel Length relative to normal length |
|---|---|---|
| Conventional Fast Circuit | Thinner | Shorter |
| Exemplary Fast Circuit | Thicker | Shorter |
| Conventional Slow Circuit | Thicker | Longer |
| Exemplary Slow Circuit | Thinner | Longer |

Table 1 shows that conventional CMOS skewing, skews the gate-insulator thickness and channel length in the same direction (that is, by increasing both the thickness and the length or by decreasing both the thickness and length) to achieve its fast and slow performance extremes based on transconductance. On the other hand, the exemplary embodiment skews the gate-insulator thickness and channel length in opposite directions to achieve its performance extremes based on capacitance, or more generally, a transistor characteristic other than transconductance.

Figure 3:
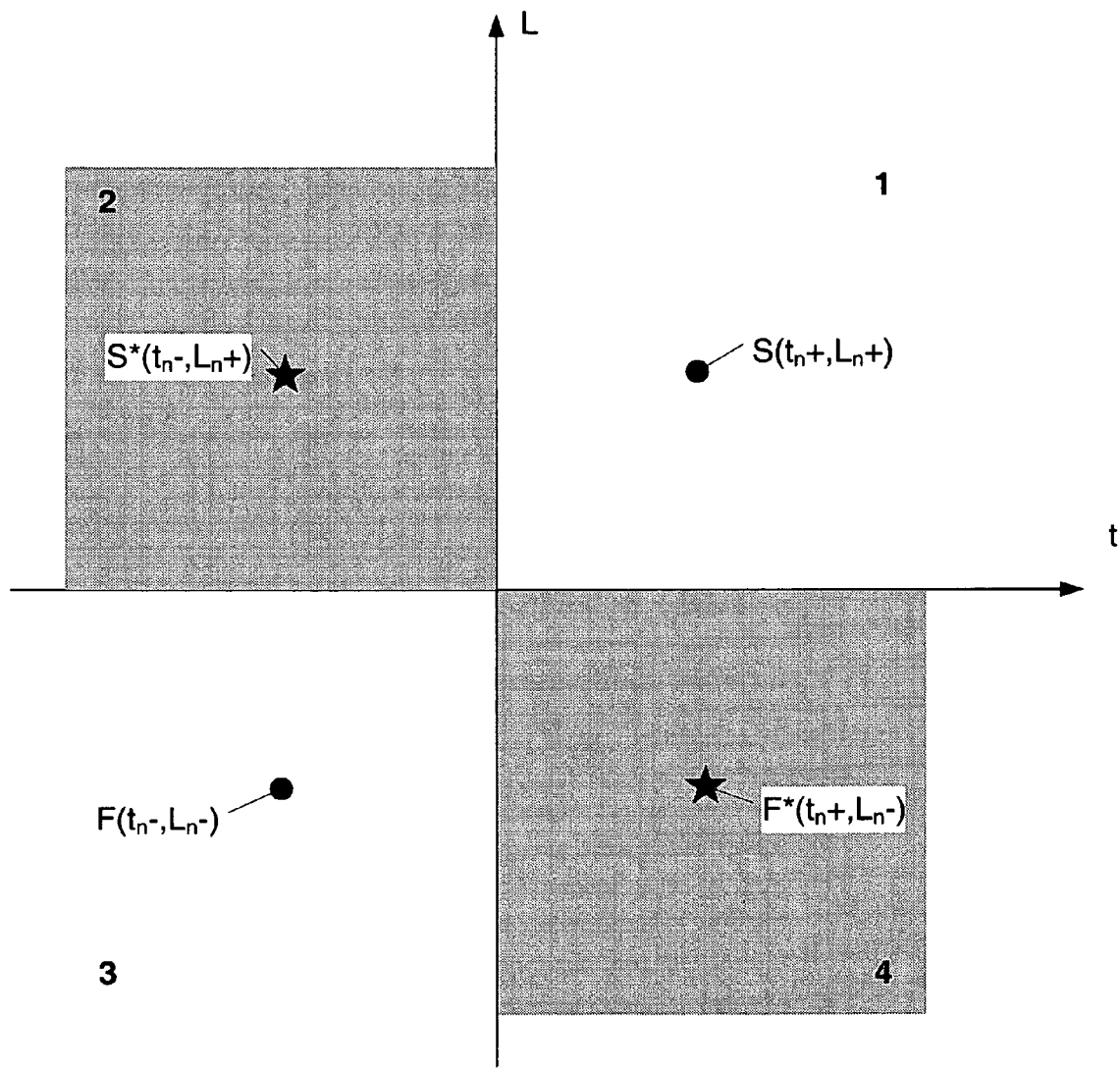
FIG. 3 is a graph showing a comparison of conventional process variance for CMOS integrated circuits and an exemplary process variance in accord with the present invention.

FIG. 3 shows this difference between the exemplary CMOS skew lot and conventional CMOS skew lot in a different way. Specifically, FIG. 3 shows a two-dimensional space 300 representing all possible variations of the two transistors traits, gate-insulator thickness and channel length, around a nominal point N ($t_n$, $L_n$). The conventional slow and fast skew lots rely on skewing the dimensions for both transistors features in the same direction, and thus use respective quadrants I and III, as indicated by slow skew point S($t_n$+, $L_n+$) and fast skew point $F(t_n-, L_n-)$. In contrast, the exemplary embodiment skews these traits in opposite directions as evidenced by slow skew point $S^*(t_n-, L_n-)$ in quadrant II and fast skew point $F^*(t_n-, L_n-)$ in quadrant IV. (Note that for convenience the magnitude of variance or maximal skew is assumed to be symmetric (that is, the same magnitude for slow and fast); however, it need not be. Also note that the graph makes no distinction between n- and p-channel devices since their respective skews occupy the same quadrants; however in practice, the skews for n- and p-channel can differ.)

Another embodiment of the invention varies transistor channel width in combination with the channel length and insulation thickness to form its slow and fast transistors. The table below summarizes these variances.

TABLE 2

Summary of Parameter Variances for Alternative Embodiment

| Parameter | Nominal or Typical Dimension (nm) | +/− Variation from Nominal (nm) | +/− % Variation from Nominal |
|---|---|---|---|
| Tox_nfet | 4.2 | 0.25 | 5.95% |
| L_nfet | 180* | 13 | 7.2% |
| W_nfet | 1800** | 13 | 0.72% |
| Tox_pfet | 4.2 | 0.25 | 5.95% |
| L_pfet | 180* | 9 | 5.0% |
| W_pfet | 1800** | 9 | 0.5% |

NOTES:
(*)The "typical" value for L is for a 0.18 micron process. In many circuits designed in this process, L values range from 180 nm to 1000 nm (or even larger).
(**)This embodiment follows the common practice of making the channel width W ten times larger than the channel length. In many circuits, the channel width ranges from 300 nm to 20000 nm (or even larger).

The dimensions noted are effective dimensions; however, the scope of the invention also includes the drawn dimensions.

Exemplary Fabrication Method

Figure 4:
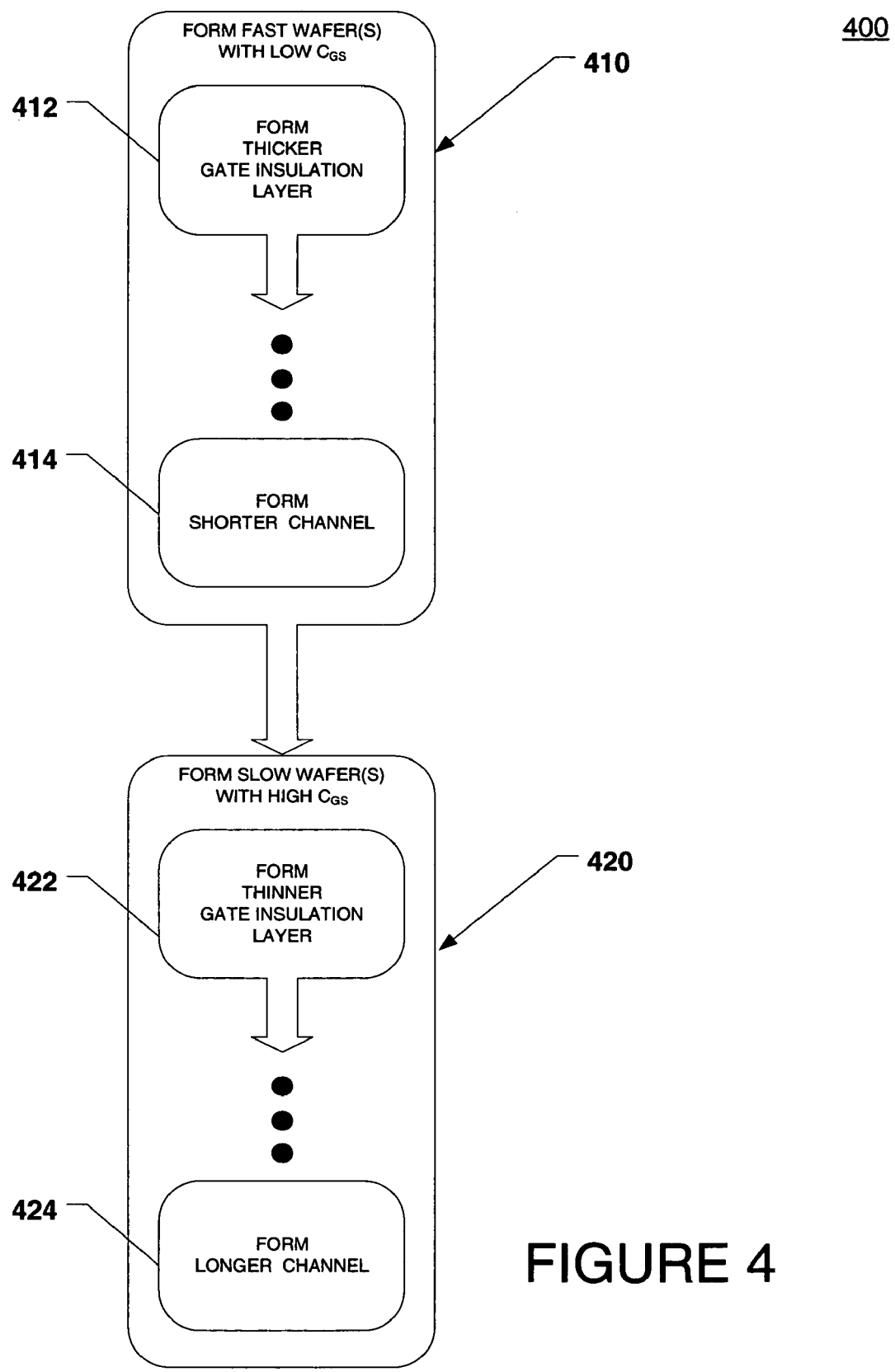
FIG. 4 is a simplified flow chart of an exemplary method of fabricating skew lot 100.

FIG. 4 shows a simplified flow chart 400 of an exemplary method of fabricating the fast and slow wafers of skew lot 100. In particular, the flow chart includes process blocks 410 and 420, with block 410 representing fabrication of fast wafer 110 and block 420 presenting fabrication of slow wafer 120. (Some other embodiments perform blocks 410 and 420 in reverse order or in parallel.) Block 410 includes process blocks 412 and 414. Block 412 entails formation of a thicker gate-insulation layer, and block 414 entails formations of a shorter channel. Similarly, block 420, which represents formation of slow wafer, that is, wafers with higher gate-to-source capacitance, includes process blocks 422 and 424. Block 422 forms a thinner gate-insulation layer, and block 424 forms a longer channel.

More precisely, exemplary fabrication of the fast and slow wafers entails varying or skewing certain aspects of a conventional CMOS fabrication process that is tuned to produce the nominal or average gate-insulator thickness $t_n$ and the nominal or average channel length $L_n$. Specifically, the thicker and thinner gate-insulator thicknesses (that is, fast- and slow-insulator thicknesses $t_F$ and $t_S$) can be achieved in a number of ways. For example, one embodiment forms the thicker and thinner gate insulators by varying the rate of thermal oxidation of a semiconductive substrate for a given time period or holding the rate constant and varying duration of the thermal oxidation procedure. Another embodiment, which relies on deposition to form the gate insulator, varies the deposition rate while holding the deposition time constant or holds the deposition rate constant while varying the deposition time. Still other embodiments grow or deposit insulative material and then use planarization procedures to achieve the desired fast thickness. Thus, the present invention is not limited to a particular method of controlling the thickness of gate-insulation layers.

There are also a number of ways to achieve the shorter and longer channel lengths (fast- and slow-channel lengths $L_F$ and $L_S$). For example, one embodiment varies the length dimension of the gate and forms the source and drain in self-alignment with the gate using ion implantation, thereby varying the channel length. Another embodiment maintains the nominal, lateral gate dimensions and alters the ion-implantation procedure by varying a rate of ion diffusion or increasing the length of an ion-diffusion period. Thus, the present invention is not limited to a particular method of producing the desired channel lengths.

Another aspect of the present invention concerns the modeling and simulation of electrical circuits. In particular, CMOS integrated analog circuits, such as LC oscillators, can also be modeled to include transistors with increased or decreased gate-to-source capacitances. For yield-prediction, however, the gate-to-source capacitances would be based on variation of the nominal gate-insulator thickness and channel widths as described above.

CONCLUSION

In furtherance of the art, the inventors have presented a new type of skew lot suitable for simulating, testing, and/or making yield predictions for circuits, such as oscillators. In contrast to conventional skew lots which are based on increasing or decreasing the transconductance of the transistors of a particular circuit, the new type of skew lot is based on increasing or decreasing the gate-to-source capacitance of the transistors.

One exemplary skew lot includes identically-configured fast and slow versions of an integrated circuit. The fast versions, which exhibit a decreased gate-to-source capacitance, include transistors with shorter than normal channels and thicker than normal gate insulators. And, the slow versions, which exhibit an increased gate-to-source capacitance, include field-effect transistors with longer channels and thinner gate insulators.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

The invention claimed is:

1. A skew lot for a CMOS integrated circuit design including a plurality of interconnected field-effect transistors, the skew lot comprising:
   a plurality of integrated circuits, with each integrated circuit including a plurality of n-channel and p-channel field-effect transistors interconnected according to the integrated circuit design,
   wherein each transistor of the plurality of interconnected field-effect transistors in the design has a nominal gate-insulator thickness and a nominal channel length,
   wherein each field-effect transistor in the plurality of integrated circuits has a fabricated gate-insulator thickness and a fabricated channel length, and the fabricated gate-insulator thickness is skewed from the nominal gate-insulator thickness, and the fabricated channel length is skewed from the nominal channel length to exhibit process variance of an electrical characteristic other than transconductance, and wherein in each transistor having the fabricated gate-insulator thickness skewed to be greater than the nominal gate-insulator thickness, the fabricated channel length of the transistor is skewed to be less than the nominal channel length, and in each transistor having the fabricated gate-insulator thickness skewed to be less than the nominal gate-insulator thickness, the fabricated channel length of the transistor is skewed to be greater than the nominal channel length.

2. The skew lot of claim 1, wherein each field-effect transistor has the fabricated gate-insulator thickness and the fabricated channel length skewed to exhibit variance of a transistor capacitance.

3. The skew lot of claim 1, wherein each field-effect transistor has the fabricated gate-insulator thickness and the fabricated channel length skewed to exhibit variance of gate-to-source capacitance.

4. The skew lot of claim 1, wherein each of the plurality of n-channel or p-channel transistors has a fabricated channel length skewed to be greater or less than an average channel length for non-skewed transistors and a fabricated gate-insulator thickness skewed to be greater or less than an average gate-insulator thickness for non-skewed transistors.

5. The skew lot of claim 1, wherein each integrated circuit comprises an LC oscillator.

6. A skew lot for a CMOS integrated circuit design including a plurality of interconnected field-effect transistors, the skew lot comprising:
   a plurality of integrated circuits, with each integrated circuit including a plurality of n-channel and p-channel field-effect transistors interconnected according to the integrated circuit design,
   wherein the field-effect transistors have at least a first feature having a first nominal dimension and a second feature having a second nominal dimension, fabrication of the field-effect transistors being skewed so as to produce a first fabricated dimension greater than the first nominal dimension and a second feature having a second fabricated dimension less than the second nominal dimension to exhibit process variance of an electrical characteristic of the field-effect transistors, and
   wherein each field-effect transistor has a fabricated gate-insulator thickness skewed to be at least five percent greater than a nominal gate-insulator thickness and a fabricated channel length skewed to be at least five percent less than a nominal channel length.

7. The skew lot of claim 6, wherein the first feature and the second feature are skewed to exhibit an extreme process variance of a transistor characteristic other than transconductance.

8. The skew lot of claim 6, wherein each integrated circuit includes an LC oscillator.

9. A skew lot for a CMOS integrated circuit design including a plurality of interconnected field-effect transistors, the skew lot comprising:
   a plurality of integrated circuits, with each integrated circuit including a plurality of n-channel and p-channel field-effect transistors interconnected according to the integrated circuit design,
   wherein the field-effect transistors have at least a first feature having a first nominal dimension and a second feature having a second nominal dimension, fabrication of the field-effect transistors being skewed so as to produce a first fabricated dimension greater than the first nominal dimension and a second feature having a second fabricated dimension less than the second nominal dimension to exhibit process variance of an electrical characteristic of the field-effect transistors,
   wherein each field-effect transistor has a fabricated gate-insulator thickness skewed to be at least five percent less than a nominal gate-insulator thickness and a fabricated channel length skewed to be at least five percent greater than a nominal channel length.

* * * * *